(12) United States Patent
Chandolu et al.

(10) Patent No.: US 10,276,529 B2
(45) Date of Patent: Apr. 30, 2019

(54) SEMICONDUCTOR DEVICES INCLUDING CONDUCTIVE PILLARS

(71) Applicant: Micron Technology, Inc., Boise, ID (US)

(72) Inventors: Anilkumar Chandolu, Boise, ID (US); Kenneth N. Hagen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 15/687,691

(22) Filed: Aug. 28, 2017

(65) Prior Publication Data

US 2017/0358547 A1 Dec. 14, 2017

Related U.S. Application Data

(62) Division of application No. 14/608,466, filed on Jan. 29, 2015, now Pat. No. 9,768,134.

(51) Int. Cl.
*H01L 23/48* (2006.01)
*H01L 23/52* (2006.01)
(Continued)

(52) U.S. Cl.
CPC ............ *H01L 24/13* (2013.01); *H01L 22/20* (2013.01); *H01L 24/03* (2013.01); *H01L 24/05* (2013.01); *H01L 25/0657* (2013.01); *H01L 25/50* (2013.01); *H01L 22/14* (2013.01); *H01L 24/02* (2013.01); *H01L 24/11* (2013.01); *H01L 24/16* (2013.01); *H01L 24/29* (2013.01); *H01L 24/32* (2013.01); *H01L 24/81* (2013.01); *H01L 24/83* (2013.01); *H01L 24/94* (2013.01); *H01L 2224/0239* (2013.01); *H01L 2224/02215* (2013.01); *H01L 2224/0345* (2013.01); *H01L 2224/0362* (2013.01); *H01L 2224/03452* (2013.01); *H01L 2224/03614* (2013.01); *H01L 2224/03914* (2013.01); *H01L 2224/03916* (2013.01); *H01L 2224/03921* (2013.01); *H01L 2224/0401* (2013.01); *H01L 2224/05017* (2013.01); *H01L 2224/05018* (2013.01); *H01L 2224/05025* (2013.01);
(Continued)

(58) Field of Classification Search
CPC ....... H01L 2225/1058; H01L 25/16113; H01L 25/5384; H01L 2224/02331; H01L 21/486; H01L 2224/32145
USPC .................................................. 257/750, 758
See application file for complete search history.

(56) References Cited

U.S. PATENT DOCUMENTS 5,376,235 A 12/1994 Langley
5,981,302 A 11/1999 Alswede et al.
(Continued)

Primary Examiner — S. V. Clark
(74) Attorney, Agent, or Firm — TraskBritt

(57) ABSTRACT

A method of forming a conductive material on a semiconductor device. The method comprises removing at least a portion of a conductive pad within an aperture in a dielectric material over a substrate. The method further comprises forming a seed material at least within a bottom of the aperture and over the dielectric material, forming a protective material over the seed material within the aperture, and forming a conductive pillar in contact with the seed material through an opening in the protective material over surfaces of the seed material within the aperture. A method of forming an electrical connection between adjacent semiconductor devices, and a semiconductor device, are also described.

19 Claims, 9 Drawing Sheets

(51) Int. Cl.
*H01L 29/40* (2006.01)
*H01L 23/00* (2006.01)
*H01L 25/065* (2006.01)
*H01L 25/00* (2006.01)
*H01L 21/66* (2006.01)

(52) U.S. Cl.
CPC .............. *H01L 2224/0557* (2013.01); *H01L 2224/0569* (2013.01); *H01L 2224/05147* (2013.01); *H01L 2224/05166* (2013.01); *H01L 2224/05187* (2013.01); *H01L 2224/05558* (2013.01); *H01L 2224/05565* (2013.01); *H01L 2224/05583* (2013.01); *H01L 2224/05647* (2013.01); *H01L 2224/05687* (2013.01); *H01L 2224/05688* (2013.01); *H01L 2224/1132* (2013.01); *H01L 2224/1145* (2013.01); *H01L 2224/1147* (2013.01); *H01L 2224/11424* (2013.01); *H01L 2224/11452* (2013.01); *H01L 2224/11462* (2013.01); *H01L 2224/11464* (2013.01); *H01L 2224/11612* (2013.01); *H01L 2224/11614* (2013.01); *H01L 2224/11622* (2013.01); *H01L 2224/11632* (2013.01); *H01L 2224/13021* (2013.01); *H01L 2224/13025* (2013.01); *H01L 2224/13147* (2013.01); *H01L 2224/16146* (2013.01); *H01L 2224/2919* (2013.01); *H01L 2224/2929* (2013.01); *H01L 2224/29191* (2013.01); *H01L 2224/29387* (2013.01); *H01L 2224/32145* (2013.01); *H01L 2224/73204* (2013.01); *H01L 2224/81* (2013.01); *H01L 2224/81203* (2013.01); *H01L 2224/81424* (2013.01); *H01L 2224/81447* (2013.01); *H01L 2224/83* (2013.01); *H01L 2224/8388* (2013.01); *H01L 2224/83102* (2013.01); *H01L 2224/83104* (2013.01); *H01L 2224/83862* (2013.01); *H01L 2224/94* (2013.01); *H01L 2225/06513* (2013.01); *H01L 2225/06541* (2013.01); *H01L 2225/06596* (2013.01); *H01L 2924/00012* (2013.01); *H01L 2924/01005* (2013.01); *H01L 2924/01013* (2013.01); *H01L 2924/01014* (2013.01); *H01L 2924/01022* (2013.01); *H01L 2924/01028* (2013.01); *H01L 2924/01029* (2013.01); *H01L 2924/0474* (2013.01); *H01L 2924/0503* (2013.01); *H01L 2924/05994* (2013.01); *H01L 2924/0715* (2013.01)

(56) References Cited

U.S. PATENT DOCUMENTS

| | | | |
|---|---|---|---|
| 6,143,396 | A | 11/2000 | Saran et al. |
| 6,414,477 | B1 | 7/2002 | Strom |
| 7,795,739 | B2 | 9/2010 | Kurihara |
| 8,324,100 | B2 | 12/2012 | Akram |
| 8,822,268 | B1 | 9/2014 | Magnus |
| 9,735,090 | B2 * | 8/2017 | Choi ............... H01L 23/481 |
| 2005/0167830 | A1 | 8/2005 | Chang |
| 2005/0245059 | A1 | 11/2005 | Yuan et al. |
| 2007/0257373 | A1 | 11/2007 | Akram |
| 2011/0095429 | A1 | 4/2011 | Akram |
| 2011/0101520 | A1 | 5/2011 | Liu |
| 2011/0101523 | A1 | 5/2011 | Hwuang et al. |
| 2011/0227216 | A1 | 9/2011 | Tseng |
| 2016/0225731 | A1 | 8/2016 | Chandolu et al. |
| 2016/0372430 | A1 * | 12/2016 | Arvin ............... H01L 24/11 |
| 2017/0373031 | A1 * | 12/2017 | Yajima ............. H01L 24/06 |
| 2018/0226342 | A1 * | 8/2018 | Lii ..................... H01L 24/02 |

\* cited by examiner

SEMICONDUCTOR DEVICES INCLUDING CONDUCTIVE PILLARS

CROSS-REFERENCE TO RELATED APPLICATION

This application is a divisional of U.S. patent application Ser. No. 14/608,466, filed Jan. 29, 2015, now U.S. Pat. No. 9,768,134, issued Sep. 19, 2017, the disclosure of which is hereby incorporated herein in its entirety by this reference.

TECHNICAL FIELD

Embodiments disclosed herein relate to semiconductor devices providing enhanced electrical interconnections. More specifically, embodiments disclosed herein relate to semiconductor devices including conductive pillars electrically connected to active circuitry of the semiconductor device.

BACKGROUND

During fabrication of a semiconductor device, after formation of circuitry (e.g., active components) on an active surface (e.g., a front side), electrical connections, such as conductive pads (e.g., ball pads, pads that facilitate die-to-die interconnection, bond pads, etc.), contact plugs, conductive traces, conductive lines, etc., may form electrical connections with the circuitry located on the front side of the semiconductor device.

Conductive pads may also be formed on an opposite, or back side, of the semiconductor device for forming electrical connections between the active surface and the back side. Conductive vias, in the form of "through-substrate vias" (TSVs) or "through-wafer interconnects" (TWIs), may interconnect the circuitry on the active surface of the semiconductor device to a location on the back side of the semiconductor device (e.g., to contact pads, such as ball pads, pads that facilitate die-to-die interconnection, bond pads, redistribution traces, etc.) where electrical connections with the circuitry on the active surface may be established. TSVs are useful for assembling semiconductor devices in compact stacked, or three-dimensional (3D), arrangements.

Thus, conductive pads on the front side, the back side, or both, may be in electrical communication with circuitry on the active surface of the semiconductor device. The conductive pads may be configured to create an electrical path between circuitry on the front side of the semiconductor device and another structure, such as external circuitry including a circuit board (e.g., a printed circuit board (PCB)), an interposer, another semiconductor device (e.g., a memory device, a logic device), etc.

After formation of the conductive pads, the conductive pads may be tested to confirm proper electrical communication between the conductive pads and circuitry of the active surface. The semiconductor device may be tested with a wafer prober using a probe card that interfaces between an electronic test system and the semiconductor device (e.g., a wafer or die). Referring to FIG. 1, probe pins of the probe card may be brought into physical and electrical contact with conductive pads 110 of a semiconductor device 100. Contact of the probe pins of the probe card with conductive pads 110 may at least score or scratch the surfaces of the conductive pads 110, leaving what are referred to in the industry as "probe marks" 115. The probe marks 115 are typically formed within a center portion of each tested conductive pad 110. However, some of the probe marks 115 may fall outside of the central portion of the conductive pad 110, forming off-centered probe marks 125. Detection of off-centered probe marks 125 during post-probe inspection may cause the conductive pads 110 to not pass die inspection, even though the device is in proper working condition. One solution to the problem of off-centered probe marks has been to mask portions of the conductive pad 110 while the electrical connections of the conductive pad 110 are tested or inspected. In this manner, any off-centered probe marks 125 may be formed in the masked portions or may not be detected during inspection. However, masking portions of the conductive pad 110 requires additional processing time and adds to the overall cost of device fabrication.

During testing with the probe card, the tips of the probe pins may undesirably damage the conductive pads 110. For example, the probe tips may over-travel and penetrate through a surface of the conductive pads 110, damaging the structure of the conductive pads 110. The damaged areas are referred to in the industry as "scrub marks." A scrub mark may provide an initiation site where corrosion of the conductive pad 110 is accelerated during subsequent device fabrication acts (e.g., during development of photoresist materials).

Referring to FIG. 2, a plan view pictomicrograph of a conductive pad 110 is shown. The conductive pad 110 includes probe marks 115 (FIG. 1) that were exposed to a developer (e.g., TMAH) that corroded the conductive pad 110 at locations of the probe marks 115, which corrosion may be particularly severe in the case of corroded scrub marks. This corrosion of the conductive pad 110 may result in a damaged portion 105 that may enhance any existing tendency toward premature device failure of the associated semiconductor device 100.

Referring to FIG. 3, a pictomicrograph of a conductive pad 110 including a damaged portion 105 formed during semiconductor testing is shown. The conductive pad 110 may be in electrical communication with a conductive plug 106. The damaged portion 105 may cause a poor mechanical (e.g., physical) and electrical connection between the conductive pad 110 and an associated conductive pillar 114 used for electrical connection to external circuitry. In some embodiments, a portion of the conductive pad 110 may remain in electrical communication with the conductive pillar 114 and the poor connection may not be detected during device testing and may undesirably comprise a portion of a completed product which, superficially, meets specifications but which will later fail in operation of the semiconductor device 100. Alternatively, the damaged portion 105 may become enlarged during subsequent processing and connections between the conductive pad 110 and surrounding materials may be damaged, leading to what is referred to in the art as "pillar fallout" in which the conductive pillar 114 becomes physically detached from the semiconductor device 100.

Referring to FIG. 4, a cross-sectional view of a semiconductor device 100 is shown. The semiconductor device 100 includes a conductive pad 110 within a dielectric material 108. The conductive pad 110 includes a damaged portion 105. The conductive pad 110 may be in electrical communication with active components on an active surface of a substrate 102 through a conductive material 104 and a conductive plug 106. The damaged portion 105 may include a crack, a void, or other discontinuity between the conductive pad 110 and at least one of the underlying conductive plug 106 and the conductive material 104. The damaged portion 105 may have been formed during probe testing of the semiconductor device 100 and may electrically isolate at least a portion of the conductive pad 110 from the underlying conductive material 104 and the conductive plug 106. During subsequent processing or during use and operation, the damaged portion 105 may become enlarged and the conductive pad 110 or materials subsequently formed on the conductive pad 110 may become detached from the semiconductor device 100, leading to premature device failure.

In addition to the aforementioned problems, surfaces of the semiconductor device 100 (e.g., the conductive pads 110) may conventionally be passivated to protect the conductive pad 110 from oxidation during subsequent processing acts. By way of example, the conductive pads 110 may be passivated with one of silicon nitride, silicon dioxide, and polyimide. Portions of the passivation may be removed with an etchant including fluorine-containing compounds to form openings through which electrical contacts to the conductive pads 110 may be formed. However, the fluorine in the fluorine-containing compounds may itself catalyze oxidation of the conductive pads 110. If the fluorinated portions of the conductive pad 110 are not removed during subsequent processing, the semiconductor device 100 may electrically or mechanically fail during production, use, or operation.

One current solution of mitigating the risks associated with damaged conductive pads 110 is to form conductive pads solely for testing the semiconductor device 100 separate from conductive pads 110 used for forming electrical connections with active circuitry of the semiconductor device 100. However, forming separate conductive test pads, as well as those for operationally connecting active circuitry, requires additional area ("real estate") on the semiconductor device 100, undesirably increasing the cost of manufacture and the size of the semiconductor device 100. By way of example, up to about twenty-five percent (25%) of the area of the semiconductor device 100 may be used for the separate conductive test pads.

DETAILED DESCRIPTION

The illustrations included herewith are not meant to be actual views of any particular systems or semiconductor devices, but are merely idealized representations that are employed to describe embodiments described herein. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing semiconductor devices, and the semiconductor devices described below do not form a complete semiconductor device. Only those process acts and structures necessary to understand the embodiments described herein are described in detail below. Additional acts to form a complete semiconductor device may be performed by conventional techniques.

According to some embodiments, a method of forming a semiconductor device includes testing electrical circuitry attached to a conductive pad of the semiconductor device and removing at least damaged portions of the conductive pad after testing thereof. A portion of a conductive pad may be removed after electrical interconnections of the conductive pad are tested (e.g., such as during wafer probing). A conductive pillar may be formed over a conductive material underlying the conductive pad and may be in direct or indirect electrical communication with active circuitry (e.g., circuitry such as transistors, capacitors, diodes, wordlines, bitlines, peripheral circuitry), including through vias, contacts, or other electrical circuitry of the semiconductor device through the conductive material and/or a conductive plug underlying the conductive material. Electrical connections between peripheral circuitry, such as an interposer, a printed circuit board, or another semiconductor wafer or die, and the conductive pillar may be formed. Conductive pillars of the semiconductor device may exhibit a uniform pillar height and include substantially planar end surfaces. The semiconductor device may include a more compact design (e.g., utilize less real estate) and may be less prone to premature device failure than conventional semiconductor devices.

Figure 1:
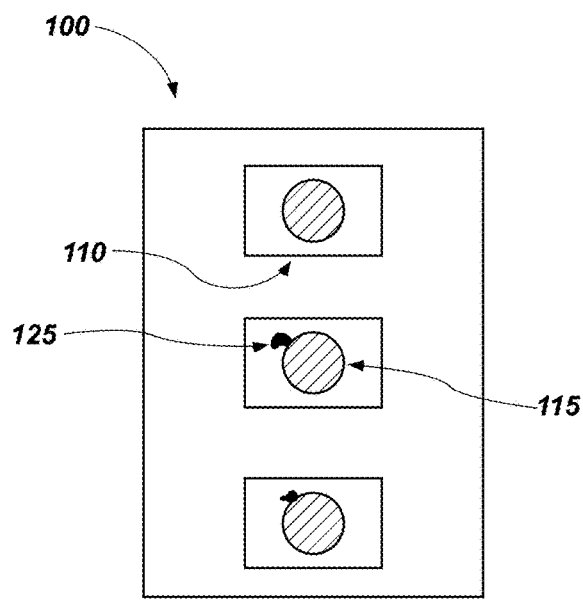
FIG. 1 is a plan view showing probe marks on conductive pads of a semiconductor device, some of which are centered and some of which are off-centered.
Figure 2:
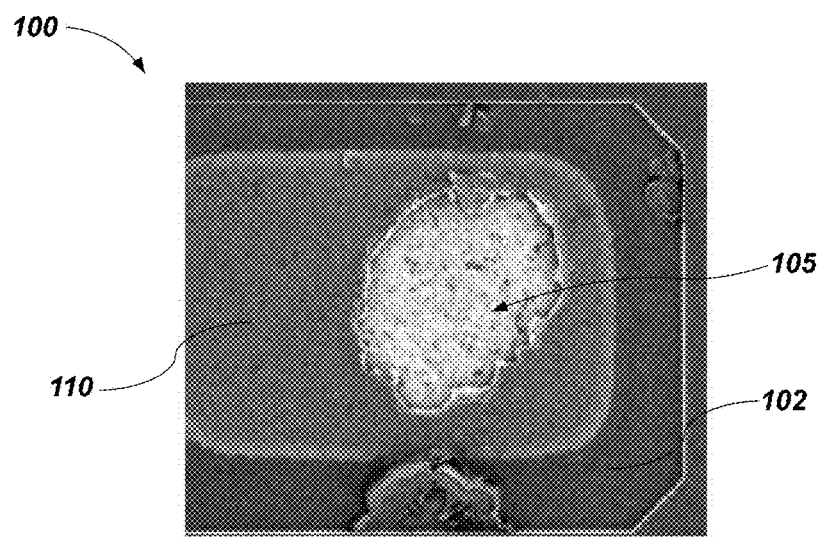
FIG. 2 is a pictomicrograph showing damaged portions of a conductive pad after testing an associated semiconductor device.
Figure 3:
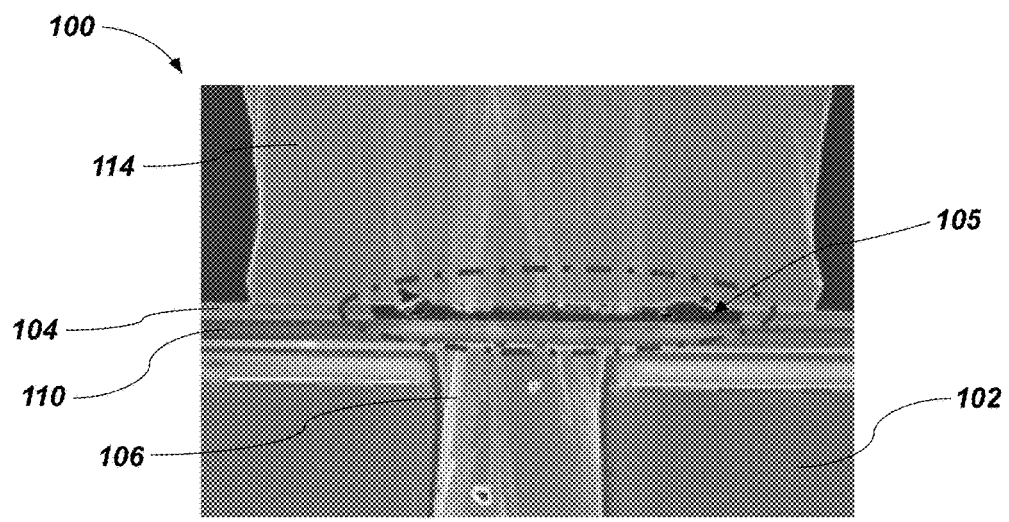
FIG. 3 is a pictomicrograph showing a plan view of a conductive pad that has been tested and subjected to subsequent processing acts.
Figure 4:
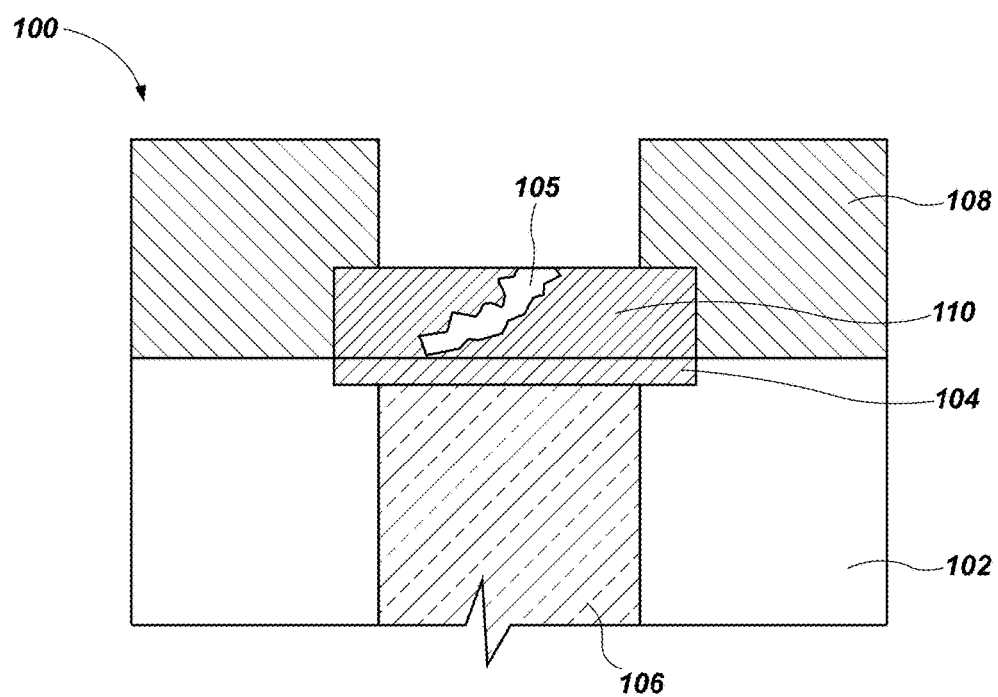
FIG. 4 is a simplified cross-sectional view showing a damaged portion of a conductive pad after testing the semiconductor device.

With reference again to FIG. 4, a semiconductor device 100 may include a conductive pad 110, electrical connections of which have been tested (e.g., with a probe pin of a wafer prober, etc.). The conductive pad 110 may include an aluminum material, a copper material, combinations thereof, or any other conductive material suitable for forming electrical connections. The conductive pad 110 may be located on a front side or a back side of the semiconductor device 100. The conductive pads 110 may include damaged portions 105 formed during probe testing of the conductive pads 110.

Figure 5A:
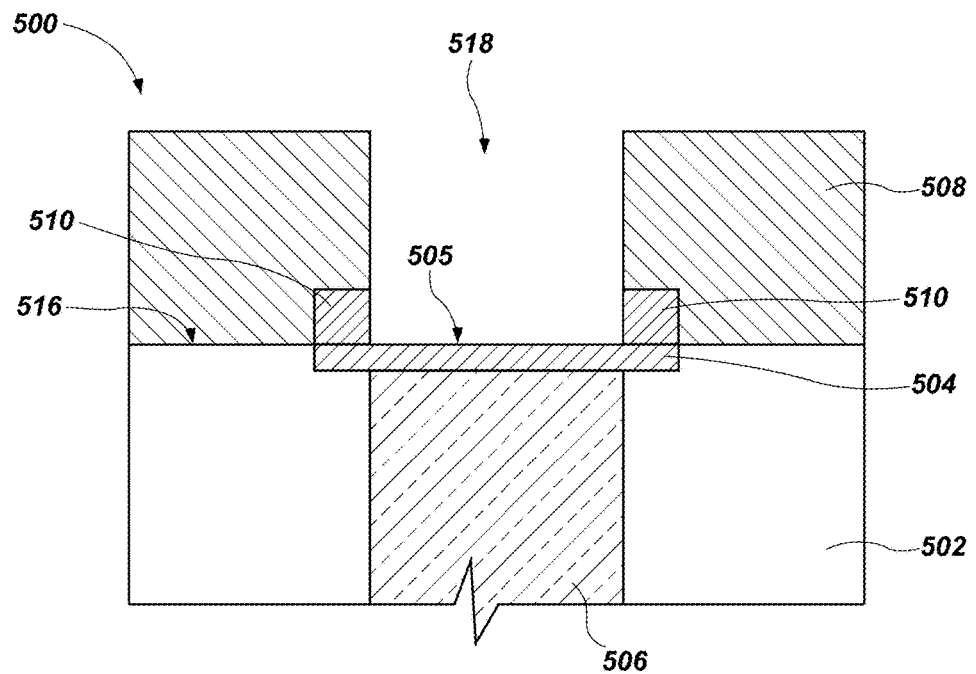
FIG. 5A through FIG. 5G are simplified cross-sectional views showing a method of forming a semiconductor device according to embodiments of the disclosure.

Referring to FIGS. 5A through FIG. 5G, a method of forming a conductive pillar over a semiconductor device is shown. The conductive pillar may be configured to electrically connect the semiconductor device to at least one of a peripheral device, another semiconductor device (e.g., another semiconductor wafer or another semiconductor die), to an interposer, or directly to higher-level packaging. Referring to FIG. 5A, a semiconductor device 500 is shown. The semiconductor device 500 may be similar to semiconductor device 100 (FIG. 4), except that the conductive pad 110 (FIG. 4) including the damaged portion 105 (FIG. 4) has been removed.

The conductive pad 110 (FIG. 4) may be removed by exposing the conductive pad 110 to an etchant that removes the conductive pad 110 without substantially removing other materials of the semiconductor device 500, leaving exposed a substantially planar surface 505 of conductive material 504. The conductive pad 110 may be removed by any suitable process for selectively removing the conductive pad 110 without substantially etching or removing a conductive material 504 or a conductive plug 506 of the semiconductor device 500. Removal of the conductive pad 110 within aperture 518 in a dielectric material 508 over a substrate 502 exposes the underlying conductive material 504. A portion of conductive pad material 510 may remain under a portion of the dielectric material 508 after removal of the conductive pad 110. It is also contemplated that only a portion of conductive pad 110 may be removed. For example, if conductive pad 110 is of 6000 Å thickness, about 5000 Å may be removed. All or a substantial portion of the conductive pad 110 may be removed by dry etching, such as reactive ion etching (RIE). The etchant may be selected in light of the composition of conductive material 504, and may include chlorine-containing gases including at least one of $Cl_2$, $BCl_3$, and combinations thereof. In other embodiments, the conductive pad 110 may be removed with a wet etchant, such as with a solution of HCl and water, or with a solution of NaOH. Subsequent materials formed over a remaining portion of conductive pad 110 or directly over the conductive material 504 on the substantially planar surface 505 thereof may include substantially conformal surfaces.

The conductive material 504 may overlie the conductive plug 506 proximate surface 516 of the substrate 502. The conductive material 504 may be located at a front side or a back side of the semiconductor device 500. The substrate 502 may be a semiconductor substrate, a base semiconductor material on a supporting substrate, a metal electrode, or a semiconductor substrate having one or more materials, structures, or regions formed thereon. The substrate 502 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form material, regions, or junctions in the base semiconductor structure or foundation.

The conductive material 504 may include any suitable conductive material for creating an electrical connection between the conductive plug 506 and a conductive pillar formed over the conductive material 504. In some embodiments, the conductive material 504 includes a copper-containing material such as copper, a copper alloy such as an alloy of copper and aluminum, or other suitable conductive materials. In some embodiments, the conductive material is copper.

The conductive plug 506 may be formed within the substrate 502. The conductive plug 506 may include a conductive material suitable for connecting active circuity of the semiconductor device 500 to the conductive material 504. The conductive plug 506 may be formed within the substrate 502 on the front side of the semiconductor device 500 and in direct electrical contact with active circuitry (e.g., logic circuitry, memory circuitry, etc.) of the semiconductor device 500. In other embodiments, the conductive plug 506 may be formed within the substrate 502 on a back side of the semiconductor device 500. In some such embodiments, the conductive plug 506 comprises a TSV extending to a back side of the semiconductor device 500 in electrical communication with active circuitry on the front side of the semiconductor device 500.

A dielectric material 508 may overlie the semiconductor device 500 at a surface 516. In some embodiments, the surface 516 is an active surface including active circuitry of the semiconductor device 500. In other embodiments, the surface 516 is a back side of the semiconductor device 500 on which the conductive material 504 is formed. The dielectric material 508 may comprise a polyimide, silicon dioxide ($SiO_2$), silicon nitride ($Si_3N_4$), tetraethylorthosilicate (TEOS), borophosilicate glass (BPSG), a PARYLENE™ polymer, or other suitable dielectric materials for isolating conductive materials of the semiconductor device 500.

Figure 5B:
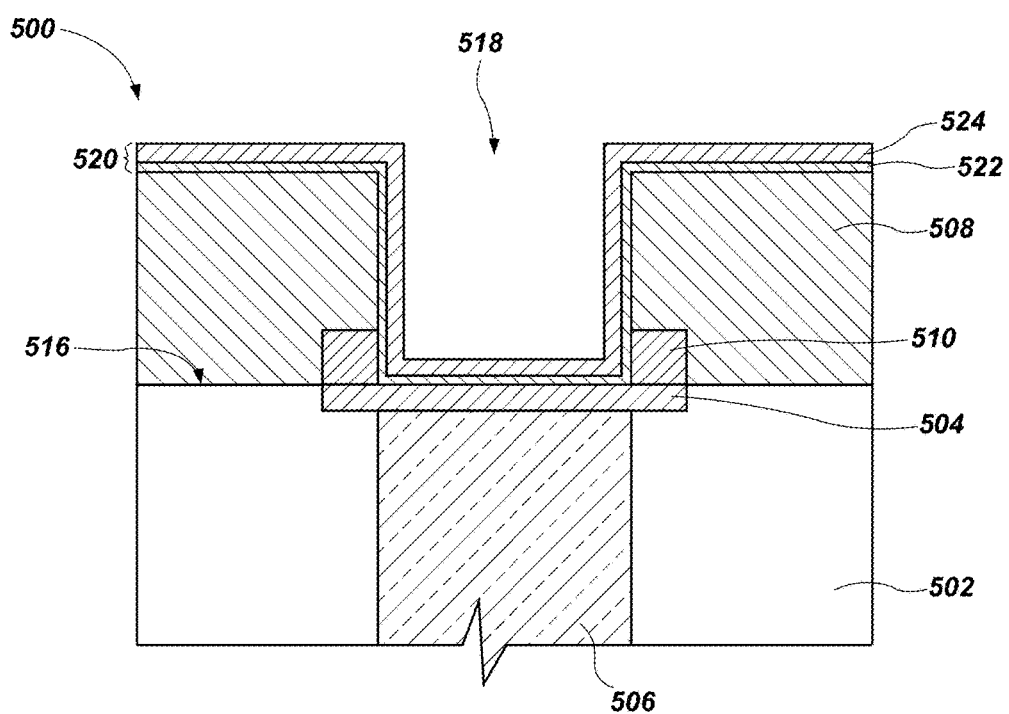

Referring to FIG. 5B, a seed material 520 may be formed over the conductive material 504 and the dielectric material 508. The seed material 520 may be formed directly over the conductive material 504 and may be in electrical communication with the conductive plug 506. In some embodiments, the seed material 520 is in electrical communication with a conductive plug 506 that comprises a TSV extending through the substrate 502. The seed material 520 may include an adhesion material 522 and a copper material 524. Each of the adhesion material 522 and the copper material 524 may be formed by atomic layer deposition (ALD), chemical vapor deposition (CVD), low pressure chemical vapor deposition (LPCVD), plasma-enhanced chemical vapor deposition (PECVD), physical vapor deposition (PVD), or other suitable conventional methods. In some embodiments, the seed material 520 is formed by PVD, which is also commonly described as sputtering.

The adhesion material 522 may include a material suitable for adhering to the conductive material 504 and may include materials such as titanium, titanium nitride, or titanium silicide. The adhesion material 522 may directly overlie and contact the conductive material 504. The adhesion material 522 may be formed to a thickness between about 50 Å and about 1,000 Å, such as between about 50 Å and about 100 Å, between about 100 Å and about 500 Å, or between about 500 Å and about 1,000 Å. In some embodiments, the adhesion material 522 is formed to a thickness of about 500 Å.

The copper material 524 may include materials such as copper or copper alloys. The copper material 524 may be formed directly over the adhesion material 522. The copper material 524 may have a thickness between about 1,000 Å and about 3,000 Å, such as between about 1,000 Å and about 1,500 Å, between about 1,500 Å and about 2,000 Å, between about 2,000 Å and about 2,500 Å, or between about 2,500 Å and about 3,000 Å. In some embodiments, the copper material 524 is formed to a thickness of about 2,000 Å.

Figure 5C:
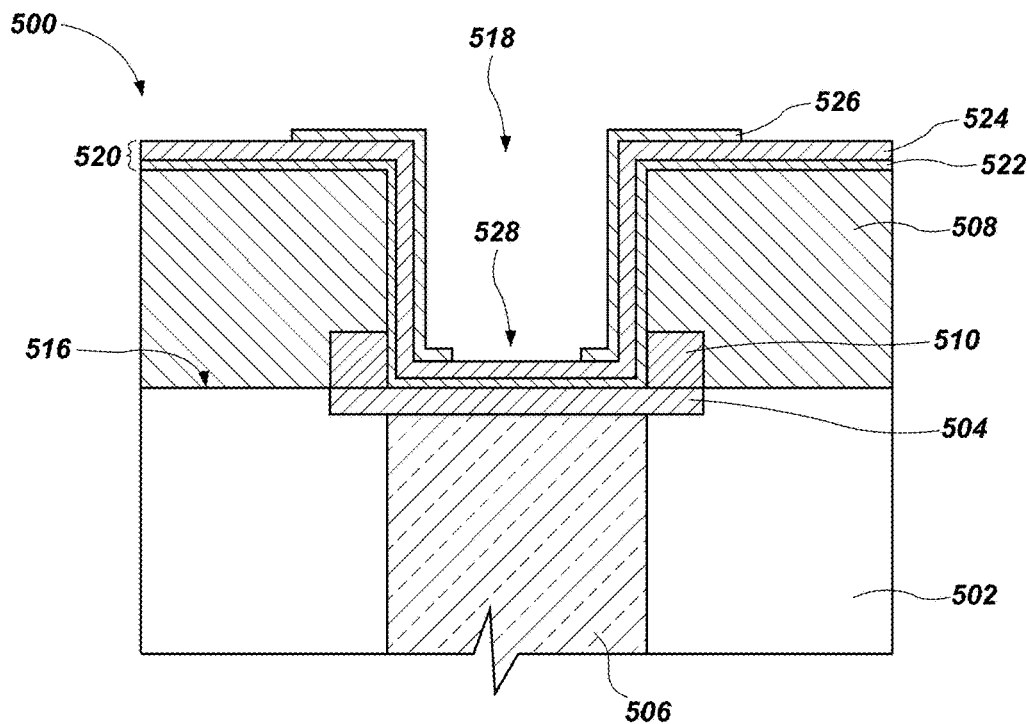

Referring to FIG. 5C, a protective material 526 may be formed over at least a portion of the seed material 520. In some embodiments, the protective material 526 may be formed directly over and in contact with the copper material 524. The protective material 526 may overlie the copper material 524 within the aperture 518 and may also overlie a portion of the copper material 524 adjacent the aperture 518. An opening 528 may be formed in the protective material 526 within the aperture 518 by techniques known to those of ordinary skill in the art that are, consequently, not described in detail herein. By way of example and not limitation, the opening 528 may be formed by photolithography, such as by forming a photoresist over the semiconductor device 500, selectively exposing portions of the photoresist to radiation, and contacting the exposed portions with a developer solution to remove the exposed portions. The copper material 524 within the aperture 518 may be exposed through the opening 528 in the protective material 526.

The protective material 526 may include any material that is not substantially susceptible to removal when the semiconductor device 500 is exposed to materials that may remove portions of the seed material 520. The protective material 526 may protect the seed material 520 over which it is formed during subsequent processing acts, such as during partial removal of portions of the seed material 520 that are not covered by the protective material 526. The protective material 526 may include a polyimide, silicon dioxide, silicon nitride, TEOS, BPSG, a PARYLENE™ polymer, etc. The protective material 526 may be the same material as the dielectric material 508. In some embodiments, the protective material 526 is a polyimide.

Figure 5D:
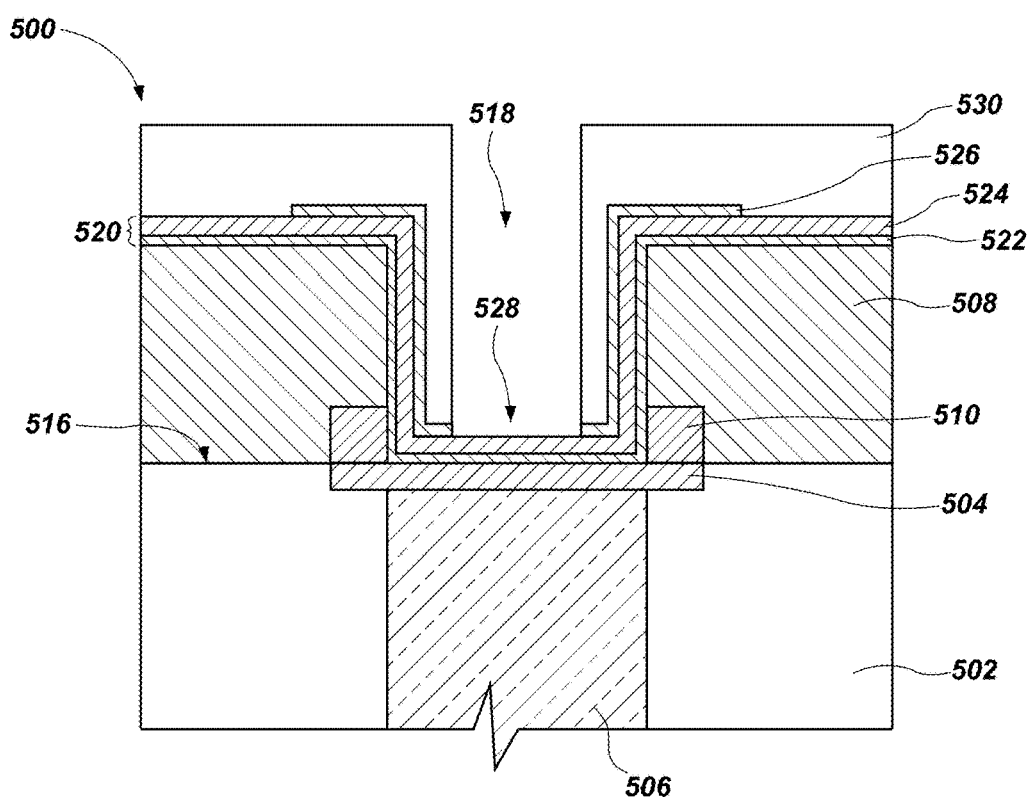

Referring to FIG. 5D, a photoresist material 530 may be formed over the semiconductor device 500 to overlie the protective material 526 and may substantially cover exposed portions of the copper material 524 outside the aperture 518. The photoresist material 530 may include a positive photoresist or a negative photoresist. In some embodiments, the photoresist material 530 is a positive photoresist. The photoresist material 530 may be patterned by techniques known to those of ordinary skill in the art that are, consequently, not described in detail herein. By way of example and not limitation, the photoresist material 530 may be patterned by selectively exposing portions of the photoresist material 530 within the aperture 518 to radiation and contacting the exposed portions with a developer solution to remove the exposed portions. In some embodiments, the developer solution includes tetramethylammonium hydroxide (TMAH). As shown in FIG. 5D, the copper material 524 within the aperture 518 may remain exposed after patterning and developing the photoresist material 530.

Figure 5E:
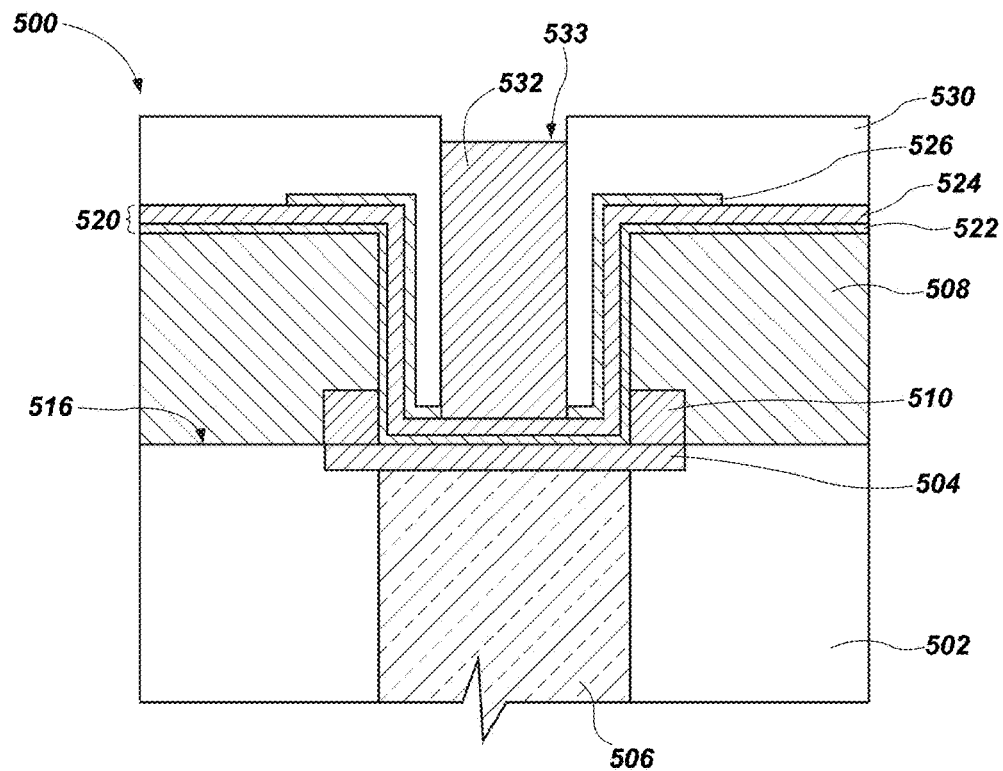

Referring to FIG. 5E, a conductive pillar 532 may be formed in the aperture 518. The conductive pillar 532 may include a substantially planar exposed end surface 533. The conductive pillar 532 may directly contact and be in electrical communication with the copper material 524 within the aperture 518 (FIG. 5D) through the opening 528 (FIG. 5D) in the protective material 526.

The conductive pillar 532 may be formed by conventional techniques such as by one or more of electrolytic deposition (e.g., electroplating), electroless deposition (e.g., electroless plating), immersion plating, conductive paste screening, patterning, material removal (e.g., wet etching, dry etching, ablation, etc.), photolithography, chemical vapor deposition, physical vapor deposition, etc., suitable for the selected material or materials of the conductive pillar 532. In some embodiments, the conductive pillar 532 is formed by electroplating. The conductive pillar 532 may be sized, configured, and arranged to provide electrical contact points for electrically connecting to bond pads, terminals, or other conductive structures (not shown) of another semiconductor device, an interposer, or higher level packaging. In some embodiments, the conductive pillar 532 includes copper or an alloy thereof. The conductive pillar 532 may include the same material as the copper material 524.

Figure 5F:
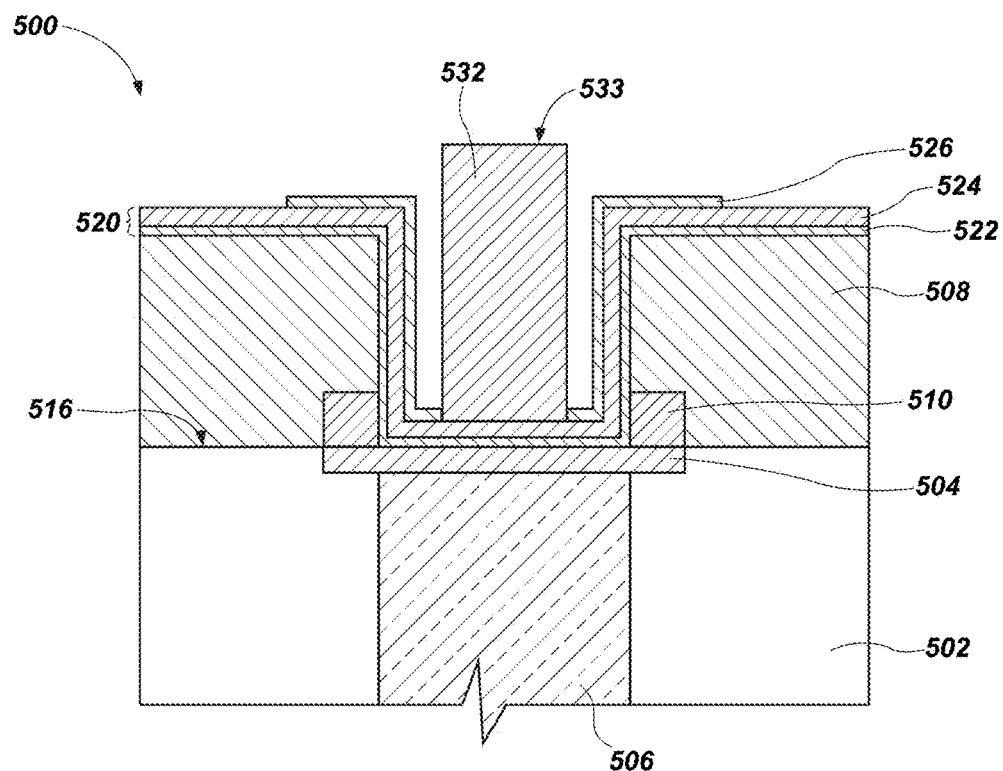

Referring to FIG. 5F, the photoresist material 530 may be removed to expose the protective material 526 outside the aperture 518 (FIG. 5D), and at sidewalls and the bottom surface of the aperture 518. The photoresist material 530 may be removed by suitable methods known to those of ordinary skill in the art that are not described in detail herein.

Figure 5G:
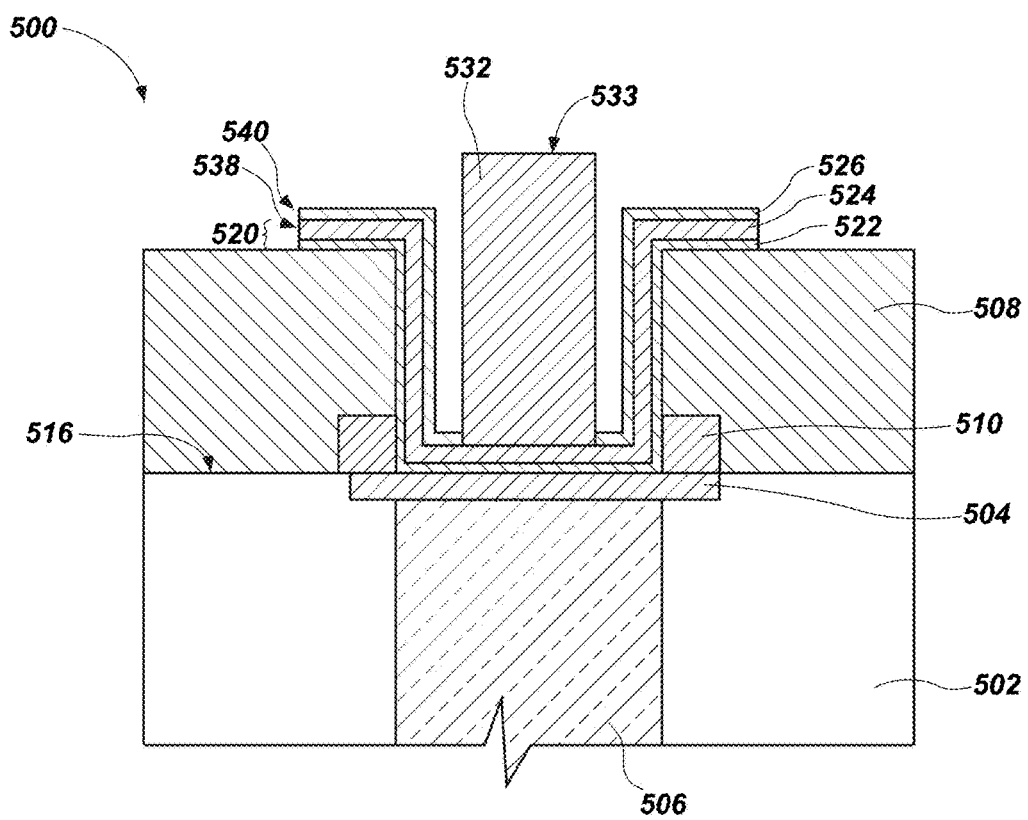

Referring to FIG. 5G, portions of the copper material 524 may be removed from over the semiconductor device 500. The copper material 524 may be removed by suitable methods, such as wet etching, known in the art that are not described in detail herein. By way of non-limiting example, the copper material 524 may be removed by exposure to an etchant including a mixture of water and one of $HNO_3$ or $H_2O_2$. Portions of the copper material 524 underlying the protective material 526 may not be removed.

Portions of the adhesion material 522 may be removed from over the semiconductor device 500. The adhesion material 522 may be removed by suitable methods known in the art that are not described in detail herein. By way of non-limiting example, the adhesion material 522 may be removed by exposing the adhesion material 524 to an etchant such as $H_2O:HF:HNO_3$, $H_2O:HF:H_2O_2$, HCl, KOH, NaOH, HF, or other suitable material. Portions of the adhesion material 522 underlying the protective material 526 may not be removed.

With continued reference to FIG. 5G, the remaining portions of the copper material 524 and the adhesion material 522 may extend laterally beyond surface of the conductive pillar 532. Side surfaces 538 of the adhesion material 522 and the copper material 524 may be substantially coplanar with a side surface 540 of the protective material 526.

The conductive pillar 532 may be electrically connected to active circuitry of the semiconductor device 500 through the copper material 524, the adhesion material 522, the conductive material 504, and the conductive plug 506. The conductive plug 506 may be located on a front side of the semiconductor device 500 and in direct electrical communication with active circuitry on the front side of the semiconductor device 500. In other embodiments, the conductive plug 506 may be located on a back side of the semiconductor device 500 and may include a TSV extending through the substrate 502 and in electrical communication with active circuitry on the front side of the semiconductor device 500. The conductive pillar 532 may be configured to be electrically connected to external circuitry, such as a PCB, an interposer, or another semiconductor device. Adjacent conductive pillars 532 of the semiconductor device 500 may include substantially coplanar exposed end surfaces 533, thus exhibiting a substantially uniform pillar height across the semiconductor device 500. Adjacent conductive pillars 532 with substantially coplanar surfaces may be suitable for stacking semiconductor devices 500 including the conductive pillars 532. Although not shown, an insulative material, such as a dielectric material or an underfill material, may be formed over the semiconductor device 500 by methods known in the art and not described in detail herein. By way of non-limiting example, a dielectric material may be formed over the semiconductor device 500 and planarized to expose exposed end surface 533 of the conductive pillar 532.

Figure 6:
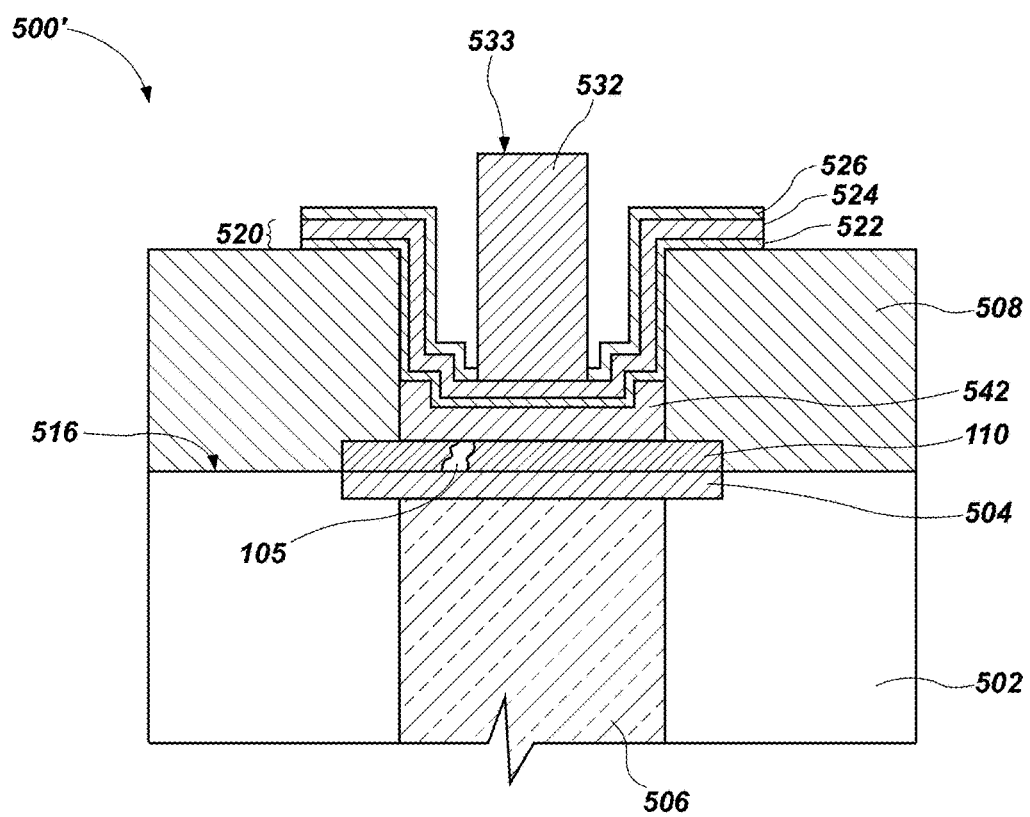
FIG. 6 is a simplified cross-sectional view showing a semiconductor device formed according to another embodiment of the disclosure.

Referring to FIG. 6, another embodiment of a semiconductor device 500' is shown. The semiconductor device 500' may be substantially similar to semiconductor device 500 (FIG. 5G), except that the semiconductor device 500' includes a relatively thick conductive pad 542 formed over at least a portion of the damaged conductive pad 110 (FIG. 6). In some embodiments, at least a portion of the damaged conductive pad 110 may be removed prior to forming the conductive pad 542. In other embodiments, the conductive pad material 510 is formed directly over the damaged conductive pad 110 without removing the damaged conductive pad 110. The conductive pad 542 may substantially cover and fill any damaged portions 105 (FIG. 6) of the conductive pad 110 (or over conductive material 504 if the conductive pad 110 has been completely removed). The conductive pad 542 may partially fill the aperture 518 (FIG. 5D). The conductive pad 542 may intervene between the conductive material 504 and the adhesion material 522.

The conductive pad 542 may be formed of an aluminum-containing material or a copper-containing material, such as aluminum, copper, or an alloy of aluminum and copper. The conductive pad 542 may be formed by PVD. The adhesion material 522 and the copper material 524 may be formed and patterned over the conductive pad 542. The semiconductor device 500' may be completed in substantially the same manner in which the semiconductor device 500 shown in FIG. 5G is formed.

Figure 7:
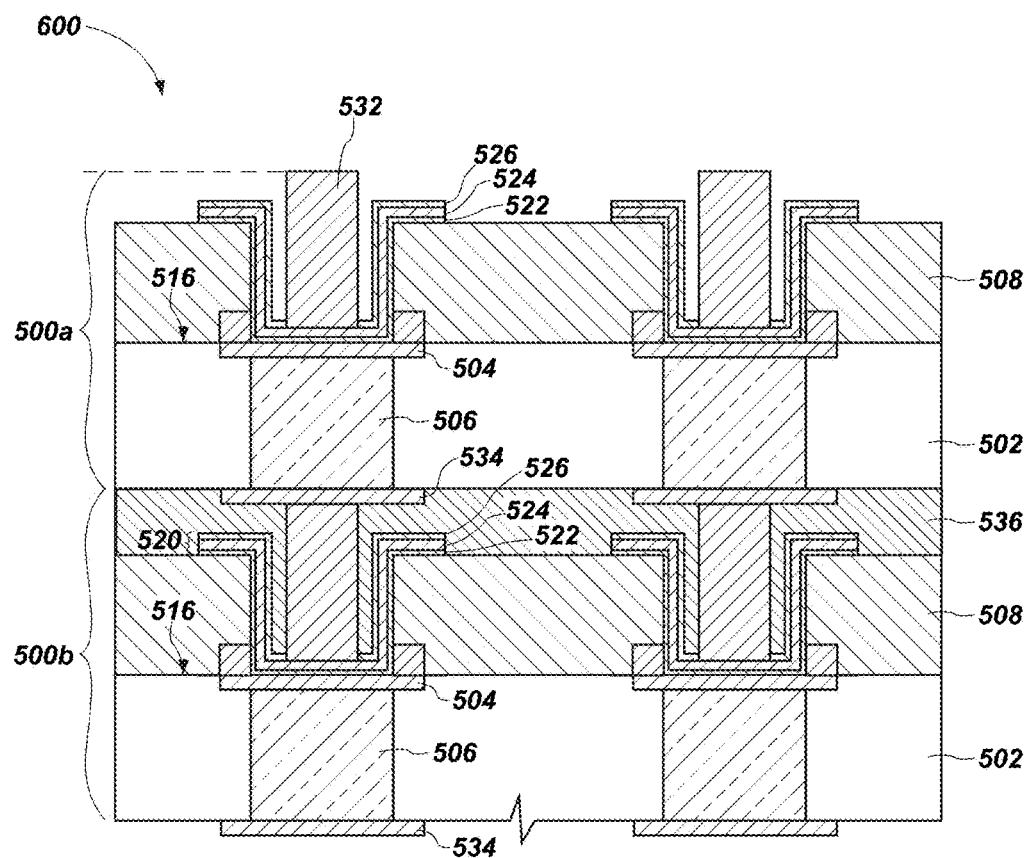
FIG. 7 is a simplified cross-sectional view showing a stack of semiconductor dies according to embodiments of the disclosure.

Referring to FIG. 7, the semiconductor devices 500, 500', may be stacked to form a stacked structure 600 of semiconductor dice 500*a*, 500*b*. For example, a conductive pillar 532 of one semiconductor die 500*b* may be contacted with a bond pad 534 of another semiconductor die 500*a* to stack the semiconductor dice 500*a*, 500*b*. The bond pad 534 may be formed of, for example, aluminum or copper. Bond pads 534 may be electrically and physically connected to conductive pillars 532 of the another semiconductor die 500*a*, 500*b* using, for example, thermocompression bonding. A wafer level underfill (WLUF) material 536 may be introduced between adjacent semiconductor dice 500*a*, 500*b*, etc., of the stacked structure 600. The WLUF material 536 may fill regions between adjacent semiconductor dice 500*a*, 500*b* during heating of the WLUF material 536. The WLUF material 536 may be subjected to an elevated temperature to at least partially cure the WLUF material 536. The WLUF material 536 may include one or more of a polymer material, a prepolymer material, a polyimide material, a silicone material (e.g., an organopolysiloxane material), an epoxy material, a resin material (e.g., a thermal plastic resin material), a curing agent (i.e., a hardener), a catalyst (i.e., an accelerator), a filler material (e.g., silica, alumina, boron nitride, etc.), a fluxing agent, a coupling agent, and a surfactant. A capillary underfill material or a paste-type underfill material may also be employed instead of a WLUF material. Conductive pillars 532 of at least one semiconductor die 500*a*, 500*b* may remain exposed to be electrically connected to peripheral circuitry such as a PCB, an interposer, or other higher level packaging. A bond pad 534 on a side of one of the semiconductor dice 500*a*, 500*b*, etc., (e.g., semiconductor die 500*b*) opposite the corresponding conductive pillar 532 of the respective semiconductor die 500*a*, 500*b*, etc., may be electrically connected to a conductive element (e.g., a bond pad, a conductive pillar, etc.) of a logic device. In other embodiments, a conductive pillar 532 of one of the semiconductor dice 500*a*, 500*b*, etc., (e.g., semiconductor die 500*a*) may be electrically connected to a conductive element of a logic device.

A method of forming a conductive material on a semiconductor device is disclosed. The method comprises removing at least a portion of a conductive pad within an aperture in a dielectric material over a substrate, forming a seed material at least within a bottom of the aperture and over the dielectric material, forming a protective material over the seed material within the aperture, and forming a conductive pillar in contact with the seed material through an opening in the protective material over surfaces of the seed material within the aperture.

A method of forming an electrical connection between adjacent semiconductor devices is disclosed. The method comprises electrically testing interconnects of a conductive pad on a semiconductor device by contacting the conductive pad with a probe of a probe card, forming a seed material over a conductive material underlying the conductive pad, forming a protective material over at least portions of the seed material, exposing a portion of the seed material through an opening in the protective material, forming a conductive pillar in contact with the exposed portion of the seed material, and contacting the conductive pillar with a conductive element of another semiconductor device.

A semiconductor device is disclosed. The semiconductor device comprises a conductive plug in electrical communication with active circuitry of a semiconductor die, a conductive material over the conductive plug, a dielectric material over the conductive material comprising an aperture exposing at least a portion of the conductive material, a seed material within the aperture and in electrical contact with the conductive material, a protective material within the aperture comprising an opening exposing a portion of the seed material at a bottom of the aperture, and a conductive pillar over surfaces of the protective material and over surfaces of the seed material.

Figure 8:
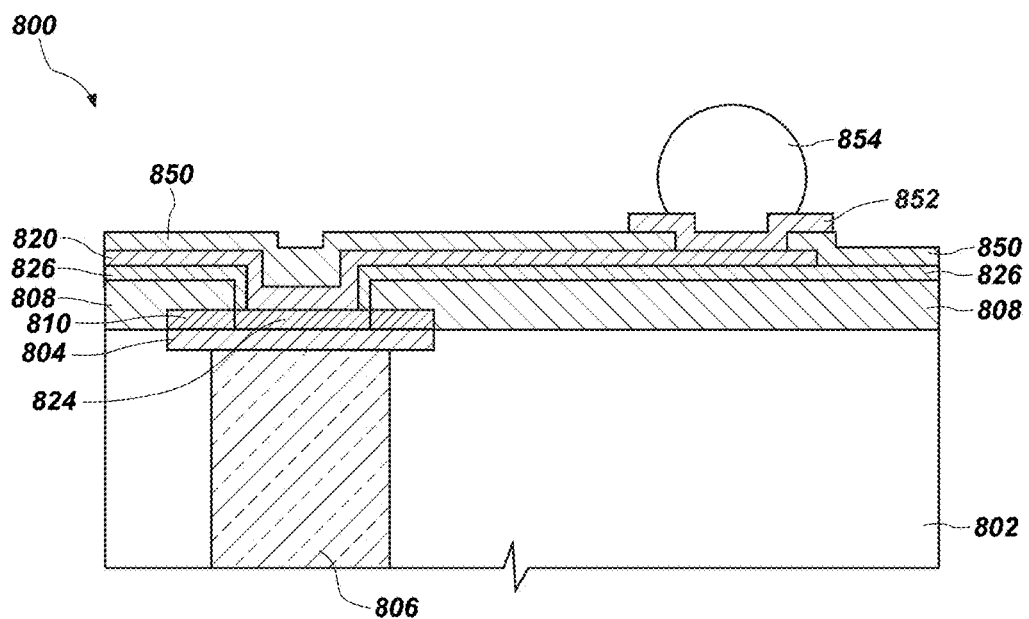
FIG. 8 is a simplified cross-sectional view showing a semiconductor device including a conductive line over a conductive pad, according to embodiments of the disclosure.

In some embodiments, after removing the damaged portion 105 (FIG. 4) of the conductive pad 110 (FIG. 4), a redistribution layer (RDL) may be formed over a planar surface of the semiconductor device instead of a conductive pillar 532 (FIG. 5E). With reference to FIG. 8, a semiconductor device 800 is shown. As described above with reference to FIG. 5A, at least a portion of a conductive pad material 810 may remain after removal of the conductive pad 110. A seed material 824 may be formed over a conductive material 804. The seed material 824 may include aluminum, copper, and combinations thereof. The conductive material 804 may overlie a conductive plug 806 disposed within a substrate 802. An insulative material 826 may be formed over portions of the seed material 824 and over a passivation material 808 of the semiconductor device 800. A portion of the seed material 824 may remain exposed through the insulative material 826 and a conductive line (e.g., a conductive trace) 820 may be formed over exposed portions by blanket deposition followed by patterning to form line 820, as known to those of ordinary skill in the art. The conductive line 820 may include aluminum, nickel, copper, or combinations thereof. Another insulative material 850 for passivation may be formed over the conductive line 820. A portion of the conductive line 820 may be exposed through the another insulative material 850 at a location laterally offset from the seed material 824, the conductive material 804, and the conductive plug 806. An under bump metallization (UBM) 852 may be formed over the exposed portion of the another insulative material 850 and a conductive bump 854 of, for example, solder may be formed over the UBM 852. Accordingly, contact points of the semiconductor device 800 may be redistributed from the seed material 824 to the conductive bump 854.

A semiconductor device is disclosed. The semiconductor device comprises a conductive plug in electrical communication with active circuitry of a semiconductor die, a conductive material over the conductive plug, a dielectric material over the conductive material comprising an aperture exposing at least a portion of the conductive material, a seed material within the aperture and in electrical contact with the conductive material, an insulative material within the aperture comprising an opening exposing a portion of the seed material at a bottom of the aperture, and a conductive trace comprising a portion over surfaces of the insulative material and over surfaces of the seed material and extending laterally from the aperture over the dielectric material to a remote location.

Semiconductor devices 500, 500', according to embodiments of the disclosure may exhibit improved device quality and reliability. The semiconductor devices 500, 500', disclosed herein may be less prone to pillar fallout and premature device failure due to damage caused by the wafer probing process and subsequent fabrication processes. Damaged portions of probe tested conductive pads that may have been corroded during the fabrication process may be removed and robust electrical connections to active circuitry may be restored. Conductive pillars formed over the semiconductor device 500, 500', may be more securely attached and electrically connected to the semiconductor device 500, 500'.

Removing at least a portion of the conductive pad may reduce electrical resistance of conductive materials (e.g., the conductive pillar) formed thereon. For example, removing at least a portion of a conductive pad comprising aluminum may remove oxidized portions thereof and enhance electrical conductivity of the conductive pad. The conductive pillars may also be formed on a more suitable surface (e.g., a substantially unoxidized and planar surface) than on surfaces of the damaged conductive pads. Further, relatively expensive processes, such as carbon deposition for inhibiting bond pad corrosion, may be avoided, and the need for inspection of incoming wafers eliminated. Current double vacuum bagging of wafers post-probe may also be eliminated, and queue time requirements relaxed. In addition, the conductive pillars may exhibit less deviation in pillar height (e.g., enhanced coplanarity) and may be more suitable for stacking semiconductor dice than conventional conductive pillars.

The semiconductor devices 500, 500', may reduce unnecessary die kill by reducing the amount of semiconductor dice that are falsely marked as ineffective due to off-centered scrub marks formed during device testing. Forming conductive pads that may be probe tested directly over active areas of the semiconductor devices 500, 500', thus eliminating the need for separate test pads, may also reduce the real estate requirements of the semiconductor devices 500, 500'. For example, conductive pads formed directly over active regions of the semiconductor device may remain electrically connected to active circuitry after device testing and conductive pillars may be formed thereon. The conductive pads may also be tested without masking regions of the conductive pad that may include off-centered scrub marks.

In addition, the semiconductor devices formed according to the methods described herein may enable shipping of the semiconductor devices in more compact packaging. For example, aluminum-containing conductive pads may be removed from a semiconductor wafer and subsequently replaced with conductive materials that do not oxidize as readily as aluminum (e.g., a conductive pillar including a copper copper-containing material). Accordingly, the completed semiconductor devices may be shipped in more cost effective and volume effective shipping packaging. By way of example, the semiconductor devices may be shipped in horizontal wafer shipper (HWS) packages wherein the semiconductor wafers are physically stacked on each other rather than in front open shipping boxes (FOSBs) in which each wafer is individually shipped in a separate FOSB to reduce exposure of the wafer to oxidation. The semiconductor devices may be shipped and stored without packaging the semiconductor devices with desiccant.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A semiconductor device, comprising:
    a conductive plug in electrical communication with active circuitry of a semiconductor die;
    a conductive material over the conductive plug;
    a dielectric material over the conductive material comprising an aperture exposing at least a portion of the conductive material;
    a seed material within the aperture and in electrical contact with the conductive material;
    a protective material within the aperture comprising an opening exposing a portion of the seed material at a bottom of the aperture; and
    a conductive pillar over surfaces of the protective material and over surfaces of the seed material.

2. The semiconductor device of claim 1, further comprising a conductive pillar of another semiconductor die in electrical contact with a conductive element of the semiconductor die, the conductive element on a side of the semiconductor die opposite the conductive pillar.

3. The semiconductor device of claim 1, further comprising a conductive element of a logic die in contact with the conductive pillar of the semiconductor die.

4. The semiconductor device of claim 1, further comprising a conductive pad over the conductive material within the aperture.

5. The semiconductor device of claim 1, wherein the conductive pillar is at least partially within the aperture.

6. The semiconductor device of claim 1, wherein the conductive plug comprises a through-substrate via in communication with active circuitry on a front side of the semiconductor device.

7. A semiconductor device, comprising:
    a conductive plug in electrical communication with active circuitry of a semiconductor die;
    a conductive material over the conductive plug;
    a dielectric material over the conductive material comprising an aperture exposing at least a portion of the conductive material;
    a seed material within the aperture and in electrical contact with the conductive material;
    an insulative material within the aperture comprising an opening exposing a portion of the seed material at a bottom of the aperture; and
    a conductive trace comprising a portion over surfaces of the insulative material and over surfaces of the seed material and extending laterally from the aperture over the dielectric material to a remote location.

8. The semiconductor device of claim 7, further comprising a conductive bump over the conductive trace at the remote location.

9. The semiconductor device of claim 7, wherein the seed material comprises aluminum, copper, or combinations thereof.

10. The semiconductor device of claim 7, wherein the seed material comprises an adhesion material and a copper material.

11. The semiconductor device of claim 10, wherein the adhesion material is in direct contact with the conductive material and the copper material is in direct contact with the adhesion material.

12. A semiconductor device, comprising:
a conductive plug in electrical communication with active circuitry of a semiconductor die;
a conductive material over the conductive plug;
a dielectric material over the conductive material;
a seed material in electrical contact with the conductive material;
a protective material over sidewalls and a portion of horizontal surfaces of the seed material; and
a conductive pillar in contact with the protective material and the seed material.

13. The semiconductor device of claim 12, wherein side surfaces of the seed material are substantially coplanar with side surfaces of the protective material.

14. The semiconductor device of claim 12, further comprising a conductive pad material over the conductive material.

15. The semiconductor device of claim 14, wherein the conductive pad material is laterally adjacent the conductive pillar and directly over the conductive material.

16. The semiconductor device of claim 12, further comprising a conductive pad over the conductive material.

17. The semiconductor device of claim 16, wherein the conductive pad is between the conductive material and the seed material.

18. The semiconductor device of claim 12, further comprising a bond pad in contact with the conductive pillar.

19. The semiconductor device of claim 12, wherein the horizontal surfaces of the seed material extend laterally beyond a width of the conductive pillar.

* * * * *